United States Patent
Xia et al.

(10) Patent No.: US 7,298,621 B2
(45) Date of Patent: Nov. 20, 2007

(54) HEAT SINK

(75) Inventors: Wan-Lin Xia, Shenzhen (CN);
Bo-Yong Yang, Shenzhen (CN);
Min-Qi Xiao, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 156 days.

(21) Appl. No.: 11/209,214

(22) Filed: Aug. 23, 2005

(65) Prior Publication Data
US 2006/0126305 A1 Jun. 15, 2006

(30) Foreign Application Priority Data
Dec. 10, 2004 (CN) ............ 2004 2 0102802

(51) Int. Cl.
*H05K 7/20* (2006.01)
(52) U.S. Cl. .............. 361/701; 361/700; 361/704; 165/80.3; 165/104.33
(58) Field of Classification Search ............ 361/689, 361/698, 699, 700, 701–712; 165/80.3, 80.4, 165/104.21–104.34; 174/16.3, 15.2; 257/714, 257/715
See application file for complete search history.

(56) References Cited

U.S. PATENT DOCUMENTS

| 1,902,350 | A | * | 3/1933 | Whitaker ............ 165/79 |
| 5,461,766 | A | | 10/1995 | Burward-Hoy |
| 5,926,370 | A | * | 7/1999 | Cromwell ............ 361/700 |
| 6,199,625 | B1 | | 3/2001 | Guerrero |
| 6,785,140 | B2 | | 8/2004 | Artman et al. |
| 2001/0001981 | A1 | * | 5/2001 | Ueda et al. ............ 165/104.33 |
| 2003/0141041 | A1 | * | 7/2003 | Chen ............ 165/80.3 |
| 2004/0052051 | A1 | | 3/2004 | Malone |
| 2005/0201059 | A1 | * | 9/2005 | Lin et al. ............ 361/700 |

FOREIGN PATENT DOCUMENTS

| JP | 411351769 A | * | 12/1999 |
| TW | M245465 | | 10/2004 |

* cited by examiner

*Primary Examiner*—Michael Datskovskiy
(74) *Attorney, Agent, or Firm*—Morris Manning Martin LLP; Tim Tingkang Xia, Esq.

(57) ABSTRACT

A heat sink for dissipating heat from an electronic device includes a base for contacting the electronic device. A U-shaped heat pipe is fixed to the base and includes an evaporating portion contacting the base and two condensing portion extending from opposite ends of the evaporating portion and through a plurality of first fins stacked together parallel to each other. A plurality of second fins extends from the base towards the first fins and supports the first fins. A reinforcement is fixed on the base and joins with some of the first fins, thereby enhancing integrity of the first fins.

14 Claims, 4 Drawing Sheets

HEAT SINK

CROSS-REFERENCE TO RELATED APPLICATIONS

This application is a co-pending application of U.S. patent application Ser. No. 11/135,569, entitled "HEAT DISSIPATION DEVICE", which was filed on May 23, 2005 and the entire contents of which are incorporated herein by reference.

BACKGROUND

1. Field of the Invention

The present invention generally relates to a heat dissipation device, and more particularly to a heat sink for an electronic device.

2. Description of Related Art

An electronic device such as a central processing unit (CPU) generates heat during operation and temperature thereof will increase beyond its normally acceptable range unless the heat is removed effectively. The temperature increase results in instability and failure of operation of the electronic device. For ensuring the normal operation of the electronic device, heat dissipation is indispensable.

Generally, a heat sink is applied to the electronic device for dissipating heat generated thereby. With the continuing boom of integrated circuits technology, designs on heat sinks change quickly. However, vibration and noises are still the problems, which must be faced and resolved.

A typical heat sink is disclosed in U.S. Pat. Publication No. 2004/0052051. In this patent publication, a heat sink comprises a base for absorbing heat and a plurality of fins stacked together parallel to each other for dissipating heat. A heat pipe is attached to the base and extends through the fins. The heat sink draws the heat from a heat source by the base, then transfers it to the fins via the heat pipe, and dissipates it from the fins outwards to a surrounding environment. In order to maximize heat dissipation capability, the fins are made to have a larger size for larger heat dissipation area, and a small thickness so that a high fin density can be provided on the base thereby further increasing the heat dissipation area. On the other hand, to get a better heat-spreading in the fins, the heat pipe passes through a middle portion of the fins. Outer portions of the large fins which are far away from the middle portion, especially outer edges of the fins, are subjected to deflection when the heat sink is mounted with a fan providing a forced airflow through the fins, or when a system airflow passes through the fins. Shock or vibration, and noises are thereby generated. The vibration will be partly transferred to the base of the heat sink and even to the electronic device, adversely impacting a normal operation of the electronic device, such as stability or useful life thereof. The impact is even more considerable when a resonant vibration occurs. Adding heat pipes to the heat sink to strengthen connection between the base and the fins may be considered; however, this increases cost of the heat sink significantly.

Therefore, an improved heat sink assembly which overcomes above problems is desired.

SUMMARY

Accordingly, what is needed is to provide a heat sink with a consolidated fin configuration, which could minimizes the shock or vibration, and noise when an airflow passes through the fins of the heat sink.

A heat sink of an embodiment of the invention comprises a base for contacting the electronic device, a plurality of first fins stacked together parallel to each other, a heat pipe attached to the base and extending through the fins for transferring heat from the base to the fins. A plurality of second fins is formed on the base and supports the first fins. Four reinforcements are fixed on the base and extend upwardly from the base; the reinforcements join some of the first fins at four corners of the first fins, thereby reinforcing integrity of the first fins.

Other advantages and novel features of the present invention will be drawn from the following detailed description of some embodiments of the present invention together with the attached drawings, in which:

DETAILED DESCRIPTION OF THE EMBODIMENTS

Figure 1:
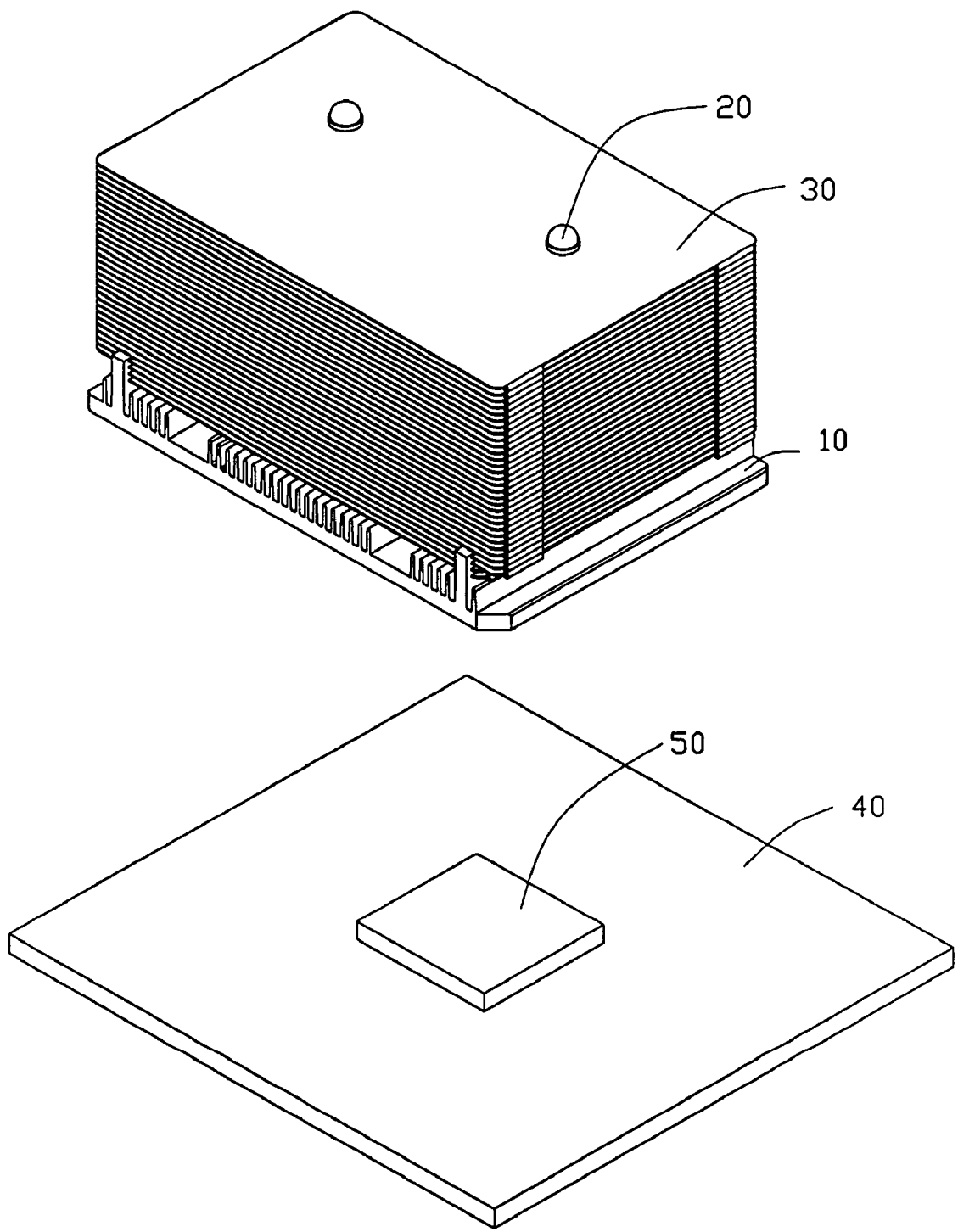
FIG. 1 is an isometric view of a heat sink, with a printed circuit board on which a CPU is mounted, in accordance with a preferred embodiment of the present invention.

In the following detailed description of the embodiments, reference is made to the accompanying drawings that illustrate embodiments of the present invention and its practices. FIG. 1 shows a heat sink in accordance with a preferred embodiment of the present invention. The heat sink is for being mounted to a printed circuit board 40 to contact an electronic device, such as a CPU 50, for heat dissipation of the CPU 50.

Figure 2:
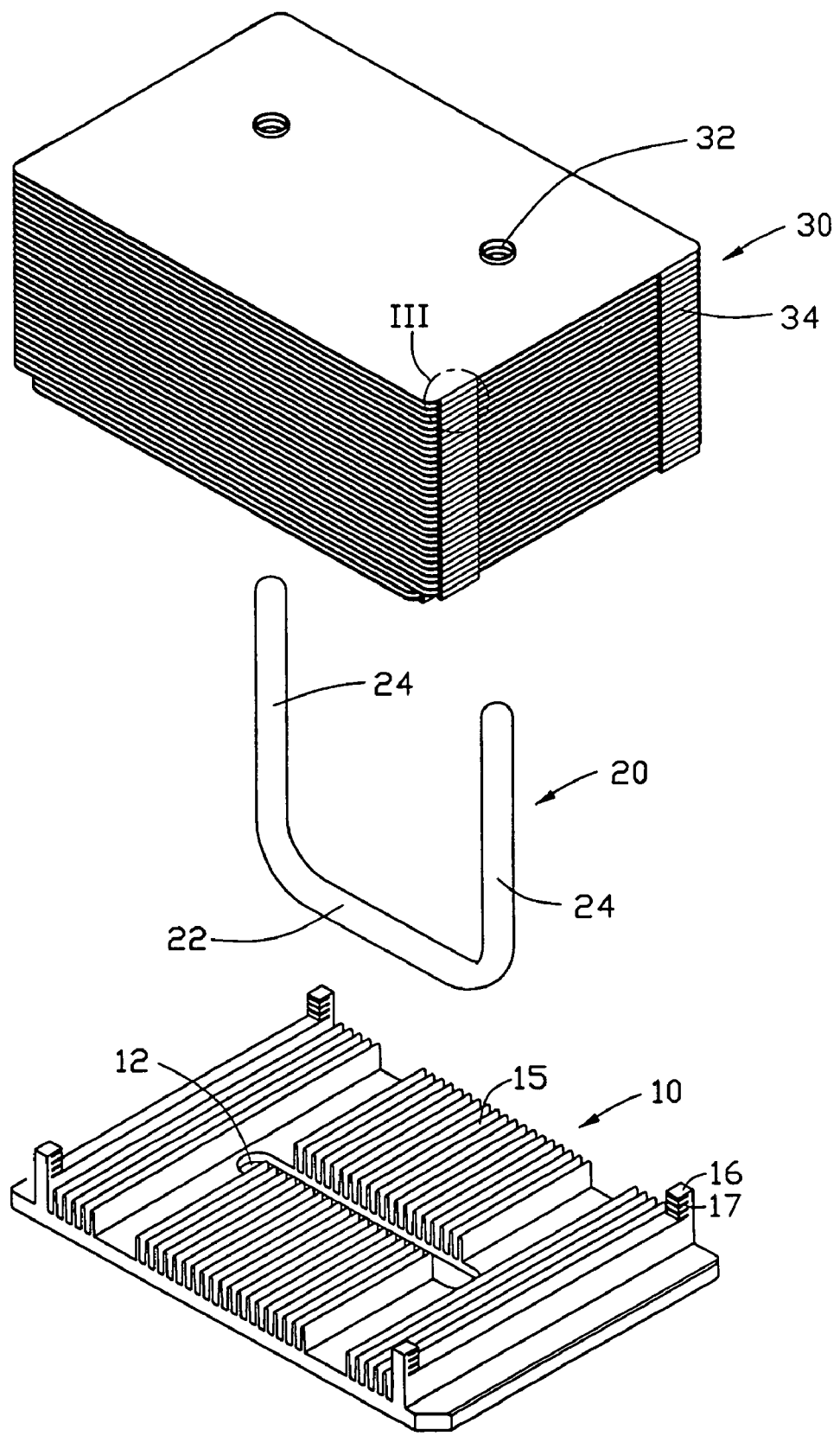
FIG. 2 is an exploded view of the heat sink in FIG. 1.

Referring to FIG. 2, the heat sink comprises a rectangular metal base 10. The base 10 has a bottom surface (not visible) for contacting the CPU 50 and drawing heat therefrom, and a top surface (not labeled) opposite to the bottom surface, with a groove 12 defined therein.

A U-shaped heat pipe 20 is attached to the base 10. The heat pipe 20 comprises a horizontal evaporating portion 22 received in the groove 12 of the base 10 and fixed therein by stannum-soldering, and two parallel condensing portions 24 extending perpendicularly from opposite ends of the evaporating portion 22. The condensing portions 24 extend away from the base 10 and pass through a plurality of first fins 30 which are stacked at uniform intervals and parallel to each other. The first fins 30 are horizontally extended when mounted to the base 10.

Figure 3:
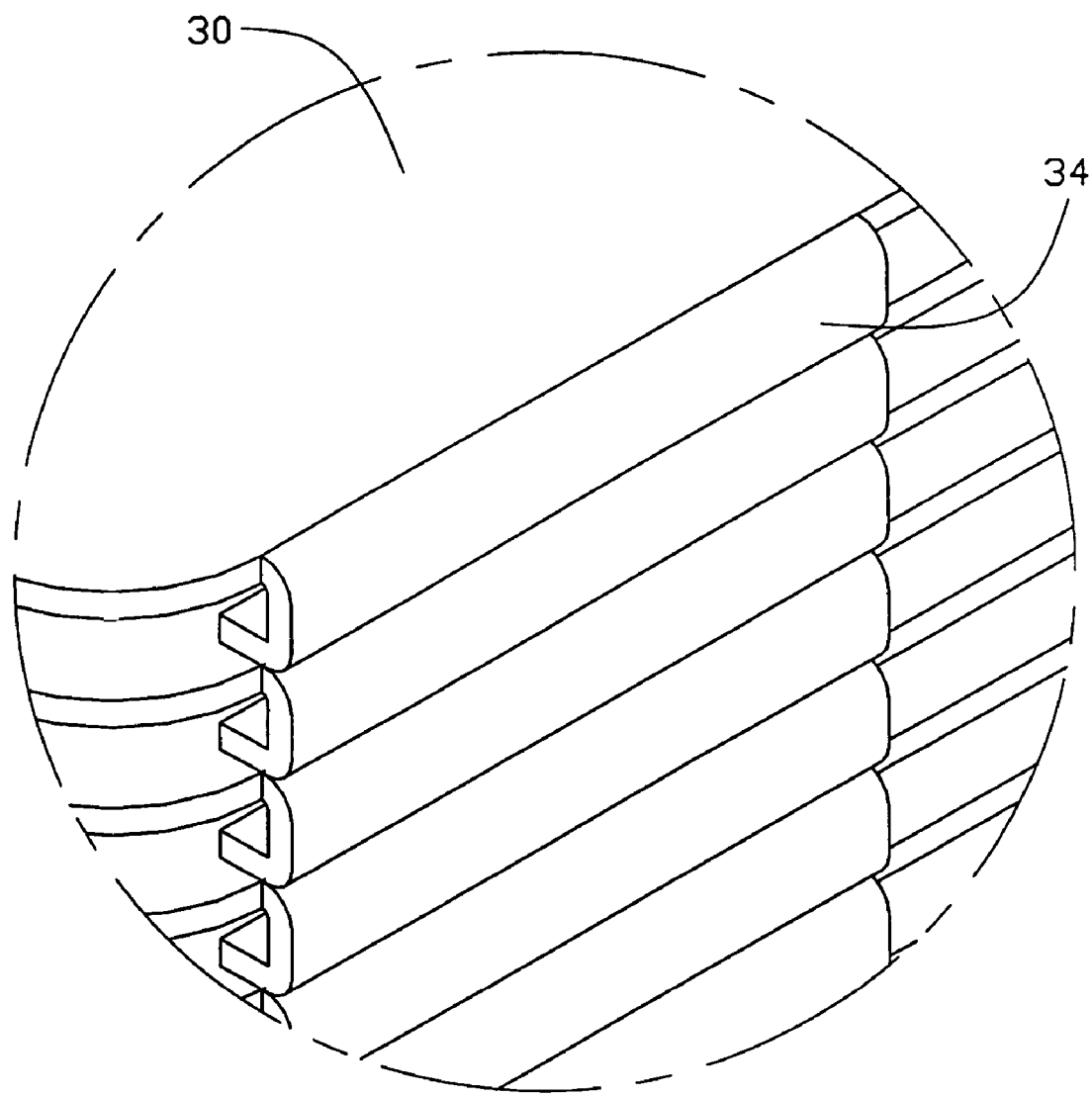
FIG. 3 is an enlarged view of circle III in FIG. 2, showing relationship between adjacent fins in detail.

Each of the first fins 30 is rectangular and forms two pairs of bearing flanges 34 which are bent perpendicularly from two opposite edges of each first fin 30 and bear against an adjacent first fin 30. The first fin 30 defines two holes 32 and a jointing flange (shown in FIG. 2 but not labeled) extends perpendicularly from each fin 30 at a circumference of each hole 32. The condensing portions 24 of the heat pipe 20 extend through the holes 32 of the fins 30 and thermally contact the jointing flanges thereof (best seen in FIG. 1). Referring to FIG. 3, the bearing flanges 34 of each first fin 30 bear against an adjacent fin 30 so as to form a fin group in which the fins 30 are stacked in sequence. The fin group is located above the base 10 by engaging with the heat pipe 20, and substantially parallel to the top surface of the base 10.

Considering heat-transferring performance of the heat pipe 20, an arc-shaped transition section from the evaporating portion 22 to the condensing portion 24 is formed. It is preferable that the heat pipe 20 is not provided with fins at the transition section. So, a vacant space is therefore defined between the top surface of the base 10 and the first fin 30, which is closest to the base 10. A plurality of second fins 15 extends integrally and perpendicularly from the top surface of the base 10 towards the first fins 30. Alternatively, the second fins 15 also can be manufactured separately and then mounted on the base 10. Presence of the second fins 15 enables said vacant space to be utilized to further facilitate direct heat dissipation of the base 10. The second fins 15 support the closest first fin 30 by soldering the closest first fin 30 and the second fins 15 together.

Two pairs of reinforcements, such as poles 16 or the like in the preferred embodiment, extend perpendicularly from the top surface of the base 10. The poles 16 have the same structure and are positioned at four corners of the base 10, respectively. Each pole 16 defines a plurality of grooves 17 spaced at uniform intervals for receiving some of the first fins 30 which are near the base 10. The number of the first fins 30 engaging with the poles 16 depends on the length of the poles 16 and the distance between adjacent first fins 30. The poles 16 can be constructed by extending integrally from the base 10 or the second fins 15, or by mounting a pre-formed pole to the base 10. And the grooves 17 defined in the poles 16 can be removed and a direct connection between the poles 16 and the first fins 30 can be established by soldering. The second fins 15 are vertically extended on the base 10.

Figure 4:
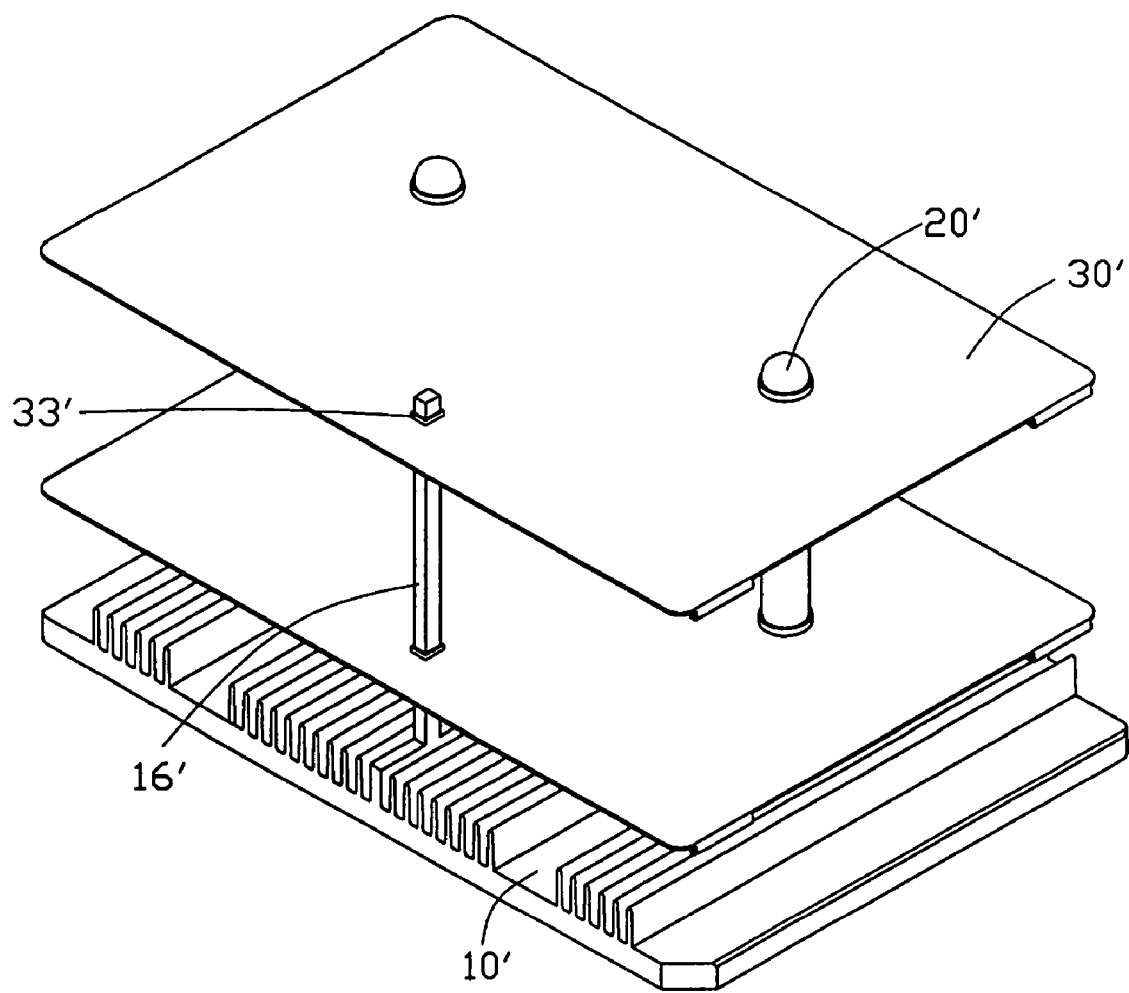
FIG. 4 is an isometric view of a heat sink, having some fins removed away, in accordance with a second embodiment of the present invention.

Referring to FIG. 4, a heat sink in accordance with a second embodiment of the present invention is illustrated. The heat sink is similar to the heat sink of the first embodiment except that a pole 16' without grooves extends perpendicularly from a top surface of a base 10' of the heat sink and through all first fins 30' which define apertures (not labeled) corresponding to the pole 16'. The pole 16' spaced from and parallel to the condensing portions of the heat pipe 20'. It is preferred that the pole 16' and the heat pipe 20' are disposed to form three supporting points for the first fins 30'. The three supporting points are located at three points of a triangle, respectively. To strengthen connection between the pole 16' and the first fins 30', a linking flange 33' extends from an edge of the aperture of each fin 30' and joins with the pole 33' by soldering.

In the heat sinks above-described, the outer portions of the first fins 30, 30', which are far away from the points where the heat pipe 20, 20' passes through the first fins 30, 30', are fixed by the poles 16, 16'. Vibration and noise, generated when an airflow passes through the first fins 30, 30' will be decreased remarkably. Since the first fins 30, 30' are stacked and secured to each other in sequence to form a fin group in which each first fin 30, 30' is positioned, when at least one of the fins 30, 30' is attached fixedly to the pole 16, 16', the vibration and noise of the whole fins group can be reduced to some extent. The more the fins 30, 30' attached to the pole 16, 16' are, the lower the vibration and the noise of the heat sinks have.

It is recognized that the invention may be susceptible to various other modifications and alternative constructions in view of this disclosure. Although the invention has been shown and described in detail herein by a preferred embodiment and certain alternatives, it should be understood that there is no intention of limiting the invention strictly to this. But rather it is the intention to cover all such other modifications and alternative constructions falling within the spirit and scope of the invention as defined in the appended claims.

We claim:

1. A heat sink comprising:
    a base;
    a heat-transferring member attached to the base;
    a plurality of first fins stacked together and attached to the heat-transferring member for dissipating heat; and
        a reinforcement fixed on the base and joining at least one of the first fins;
        wherein the heat-transferring member is a heat pipe;
        wherein the heat pipe has a U-shaped configuration and comprises an evaporating portion fixed on the base and two condensing portions extending perpendicularly from opposite ends of the evaporating portion, away from the base and through the fins; and
        wherein the reinforcement and the heat pipe joint the fins at three supporting points, the three supporting points being at three points of a triangle, respectively.

2. The heat sink as described in claim 1, wherein the reinforcement is a pole.

3. The heat sink as described in claim 2, wherein the pole extends through the at least one of the fins.

4. The heat sink as described in claim 3, wherein the pole extends through all of the fins.

5. The heat sink as described in claim 1, wherein a plurality of additional fins extends from a top surface of the base towards the first fins.

6. The heat sink as described in claim 5, wherein at least one of said additional fins supports the first fins.

7. The heat sink as described in claim 1, wherein the fins are stacked parallel to each other at uniform intervals, substantially parallel to the base.

8. The heat sink as described in claim 7, wherein each of the fins forms a pair of bearing edges bent from opposite edges thereof for bearing against an adjacent first fin.

9. A heat sink comprising:
    a base;
    a heat-transferring member attached to the base;
    a plurality of first fins stacked together and attached to the heat-transferring member for dissipating heat; and
        a reinforcement fixed on the base and joining at least one of the first fins;
        wherein the heat-transferring member is a heat pipe;
        wherein the reinforcement is a pole; and
        wherein the pole defines at least one groove receiving the at least one of the fins.

10. The heat sink as described in claim 9 further comprising another reinforcement fixed on the base and joining the at least one of the fins.

11. The heat sink as described in claim 9, wherein a plurality of additional fins extends from a top surface of the base towards the first fins.

12. The heat sink as described in claim 11, wherein at least one of said additional fins supports the first fins.

13. The heat sink as described in claim 9, wherein the fins are stacked parallel to each other at uniform intervals, substantially parallel to the base.

14. The heat sink as described in claim 13, wherein each of the fins forms a pair of bearing edges bent from opposite edges thereof for bearing against an adjacent first fin.

* * * * *